United States Patent [19]
Aoki et al.

[11] Patent Number: 5,923,985
[45] Date of Patent: Jul. 13, 1999

[54] MOS FIELD EFFECT TRANSISTOR AND ITS MANUFACTURING METHOD

[75] Inventors: Kenji Aoki; Ryoji Takada, both of Tokyo, Japan

[73] Assignee: Seiko Instruments Inc., Japan

[21] Appl. No.: 08/782,975

[22] Filed: Jan. 14, 1997

Related U.S. Application Data

[62] Division of application No. 08/538,980, Oct. 5, 1995, which is a continuation of application No. 08/441,656, May 15, 1995, abandoned, which is a continuation of application No. 08/216,764, Mar. 22, 1994, abandoned, which is a continuation of application No. 08/132,485, Oct. 6, 1993, abandoned, which is a continuation of application No. 08/058,048, May 5, 1993, abandoned, which is a continuation of application No. 07/938,499, Aug. 31, 1992, abandoned, which is a continuation of application No. 07/140,652, Jan. 4, 1988, abandoned.

[30]     Foreign Application Priority Data

| Jan. 5, 1987 | [JP] | Japan | 62-321 |
| Jan. 16, 1987 | [JP] | Japan | 62-7553 |
| Jan. 21, 1987 | [JP] | Japan | 62-11861 |
| Feb. 19, 1987 | [JP] | Japan | 62-36618 |
| Apr. 21, 1987 | [JP] | Japan | 62-97960 |
| May 15, 1987 | [JP] | Japan | 62-119543 |

[51] Int. Cl.$^6$ .......... H01L 21/336; H01L 21/20
[52] U.S. Cl. .......... 438/301; 438/478
[58] Field of Search .......... 438/142, 301, 438/305, 478

[56]     References Cited

U.S. PATENT DOCUMENTS

| 3,996,657 | 12/1976 | Simko et al. |
| 4,063,271 | 12/1977 | Bean et al. |
| 4,242,691 | 12/1980 | Kotani et al. .......... 357/23 |
| 4,317,690 | 3/1982 | Koomen et al. |
| 4,420,870 | 12/1983 | Kimura . |
| 4,525,378 | 6/1985 | Schwabe et al. .......... 427/38 |
| 4,535,530 | 8/1985 | Denda et al. .......... 29/571 |

FOREIGN PATENT DOCUMENTS

| 1168763 | 6/1984 | Canada . |
| 0203516 | 12/1986 | European Pat. Off. . |
| 56-94670 | 7/1981 | Japan . |

OTHER PUBLICATIONS

IBM Technical Disclosure Bulletin, vol. 20, No. 10, Mar. 1978, "FET Structures for Very High Performance Circuits Operating at Low Temperatures", E.F. Miersch et al.

*Primary Examiner*—Richard A. Booth
*Attorney, Agent, or Firm*—Adams & Wilks

[57]     ABSTRACT

A method of manufacturing a MOS field effect transistor comprises forming on a semiconductor substrate a first epitaxial growth layer having an impurity doping concentration lower than that of the semiconductor substrate, forming on the first epitaxial growth layer a second epitaxial growth layer having an impurity concentration higher than that of the first epitaxial growth layer and having a thickness equal to or less than a diffusion depth of a source and a drain region, and forming on the second eptiaxial growth layer a third epitaxial growth layer having an impurity concentration lower than that of the second epitaxial growth layer and having a thickness equal to or less than that of a depletion layer at a channel region.

18 Claims, 9 Drawing Sheets

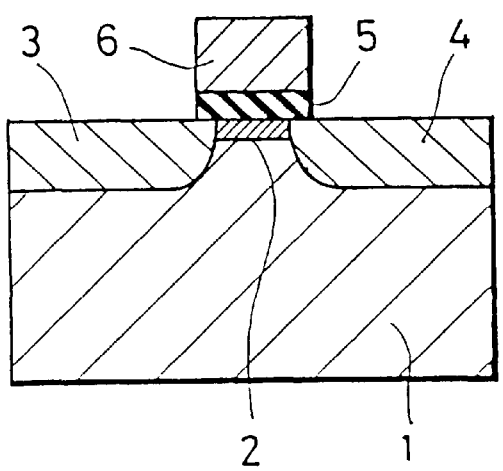
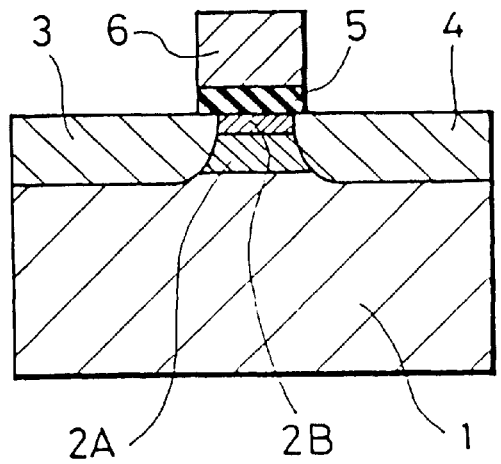
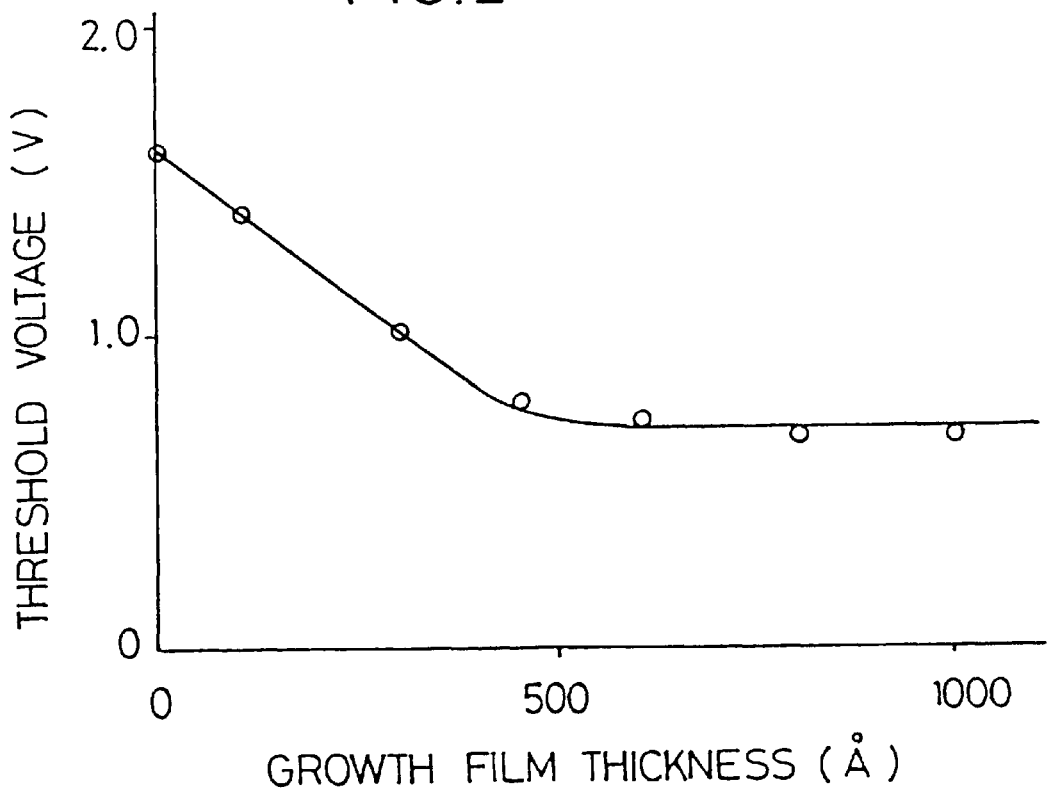

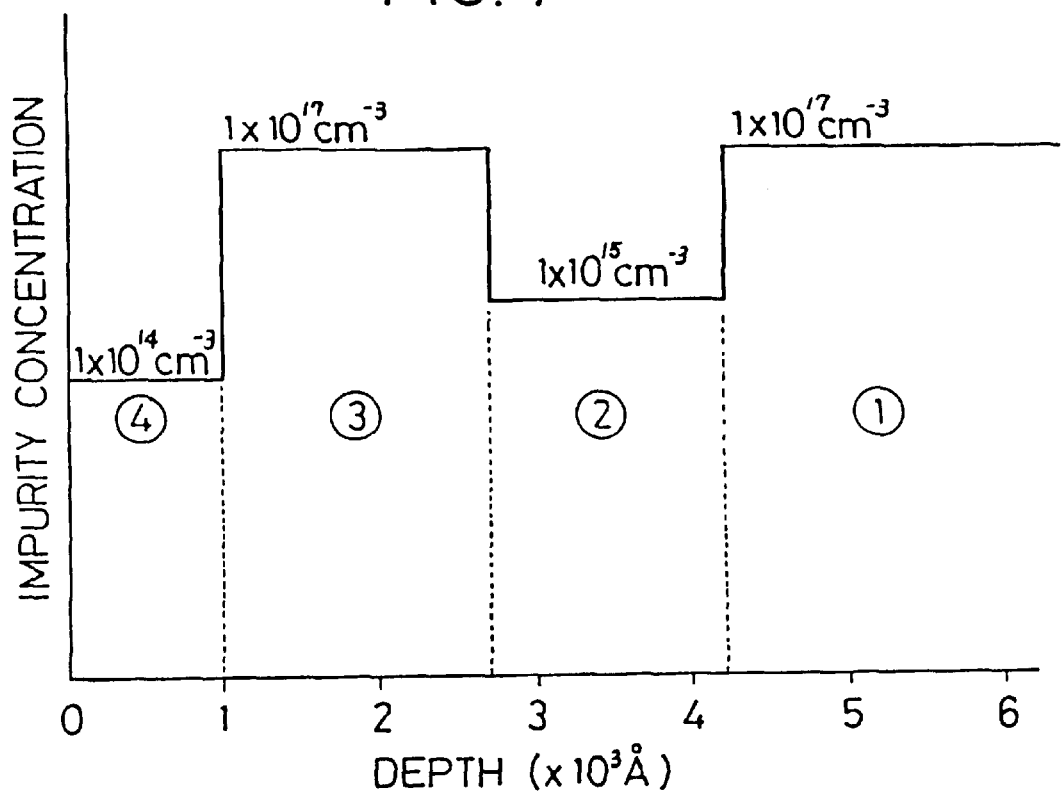

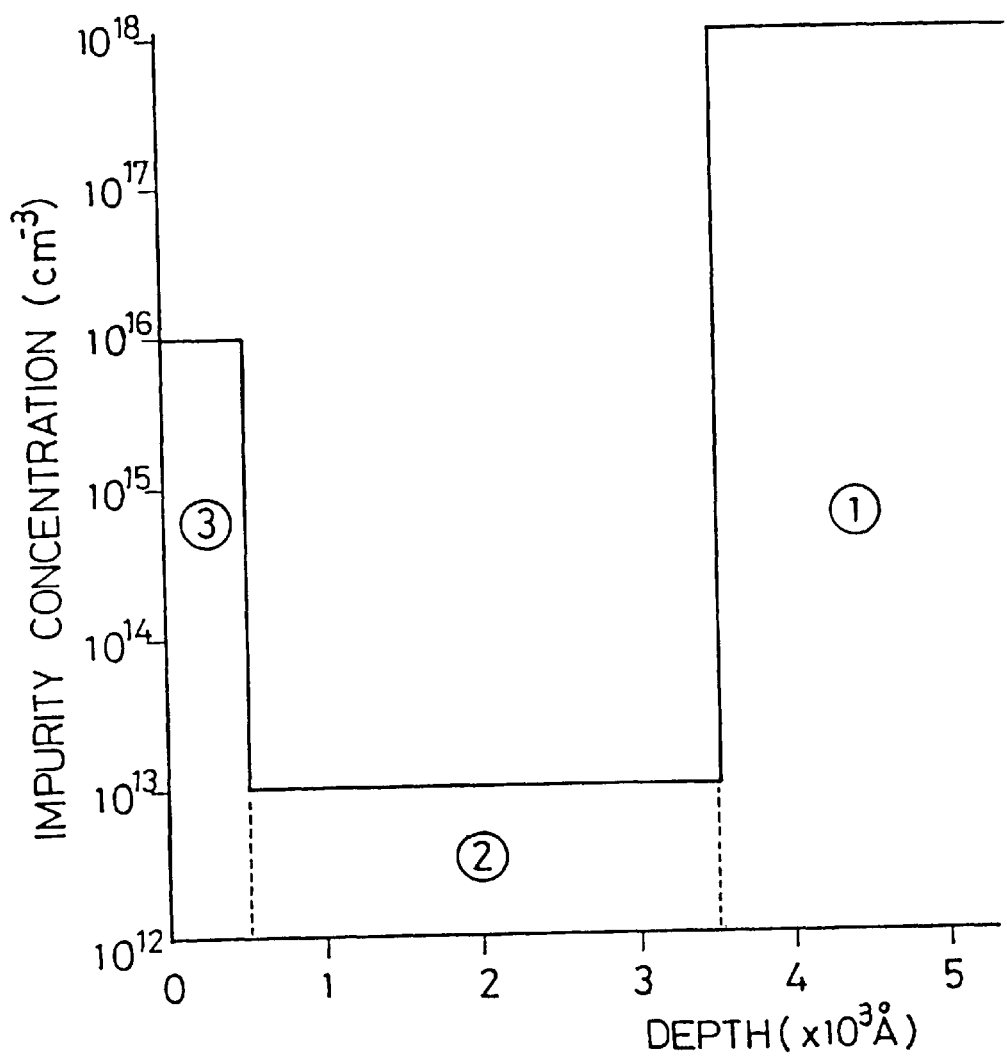

MOS FIELD EFFECT TRANSISTOR AND ITS MANUFACTURING METHOD

This is a division of application Ser. No. 08/538,980 filed Oct. 5, 1995 which is a continuation of application Ser. No. 08/441,656 filed May 15, 1995 now abandoned which is a continuation of application Ser. No. 08/216,764 filed Mar. 22, 1994 now abandoned which is a continuation of application Ser. No. 08/132,485 filed Oct. 6, 1993 now abandoned which is a continuation of application Ser. No. 08/058,048 filed May 5, 1993 now abandoned which is a continuation of application Ser. No. 07/938,499 filed Aug. 31, 1992 now abandoned which is a continuation of application Ser. No. 07/140,652 filed Jan. 4, 1988 now abandoned.

BACKGROUND OF THE INVENTION

1. Field of the Invention

The present invention relates to a MOS field effect transistor (hereinafter referred to as MOSFET) that operates with low power consumption and at a high speed and which can be used as a memory device and a switching device in computers. It also relates to the manufacturing method of the MOSFET of the present invention.

2. Prior Arts

Miniaturization of a MOSFET faces difficult problems such as short channel effects in particular. This phenomenon is characterized by lowered threshold voltage. For a given channel doping concentration, as the channel length is reduced, the depletion layer extending towards the gate becomes to serve as an additional depletion layer to the depletion layer at the drain electrode and subsequently reduces the depletion layer at the gate, which eventually lowers the threshold voltage of the device. In addition to this phenomenon, there is a problem in a CMOS structure of the latch-up which is a parasitic bipolar action. One approach to avoid latch-up is to increase the impurity concentration of the substrate thereby reducing the resistance of the substrate. However, if the impurity concentration is increased to such a level as to prevent the latch-up, the threshold voltage increases to an undesirable level. Also, if the impurity concentration in the channel region where carriers traverse is high, the effect of scattering by the impurity atoms increases generally resulting in lowered carrier mobility.

SUMMARY OF THE INVENTION

The object of the invention therefore is to solve the problems accompanied with such conventional devices as described hereinabove. In accordance with the invention, a substrate of high impurity doping concentration is used to prevent short channel effects and latch-up, and an epitaxial growth layer with low impurity doping concentration is provided at the channel region to obtain high operation speed and to control threshold voltage.

BRIEF DESCRIPTION OF THE DRAWINGS

FIG. 1A illustrates a cross-section of a MOSFET according to the invention in which the channel region comprises one type of epitaxial growth layer, FIG. 1B illustrates a cross-section of a MOSFET according to the invention in which two epitaxial growth layers of different thickness, impurity concentration and opposite conductivity to each other are formed at the channel region, FIG. 2 shows the threshold-dependence on epitaxial growth layer thickness of a MOSFET of the invention, FIG. 7 shows the vertical impurity doping profile of the epitaxial growth layer shown in FIG. 6A, FIG. 9 shows the vertical impurity doping profile of the channel region of the MOSFET shown in FIG. 8.

DETAILED DESCRIPTION OF PREFERRED EMBODIMENTS

The present invention is hereunder described in detail with reference to preferred embodiments thereof.

FIG. 1A and FIG. 1B show cross-sections of MOSFETs manufactured according to the invention. FIG. 1A shows a cross-section of a MOSFET in which on a substrate 1 of high impurity doping concentration an epitaxial growth layer 2 having an impurity doping concentration lower than that of the substrate is formed. A MOSFET shown in FIG. 1B has two epitaxial growth layers of different impurity doping concentration and different thickness provided on a substrate 1 of high impurity doping concentration. This structure provides a buried channel type device. The first epitaxial growth layer 2A has an impurity doping concentration lower than that of the substrate. The impurity of the second epitaxial growth layer 2B has a conductivity type opposite to that of the substrate and an impurity doping concentration higher than that of the first epitaxial layer.

FIG. 2 shows the threshold dependence on epitaxial growth film thickness of a MOSFET shown in FIG. 1A. In the case of the MOSFET shown in FIG. 2, the impurity doping concentration of the substrate is $1 \times 10^{17}$ cm$^{-3}$, that of the epitaxial growth layer is $1 \times 10^{14}$ cm$^{-3}$, and the gate length is 1 $\mu$m. It is estimated from FIG. 2 that the thickness of the depletion layer formed in the channel region is about 500 Å.

Figure 3:
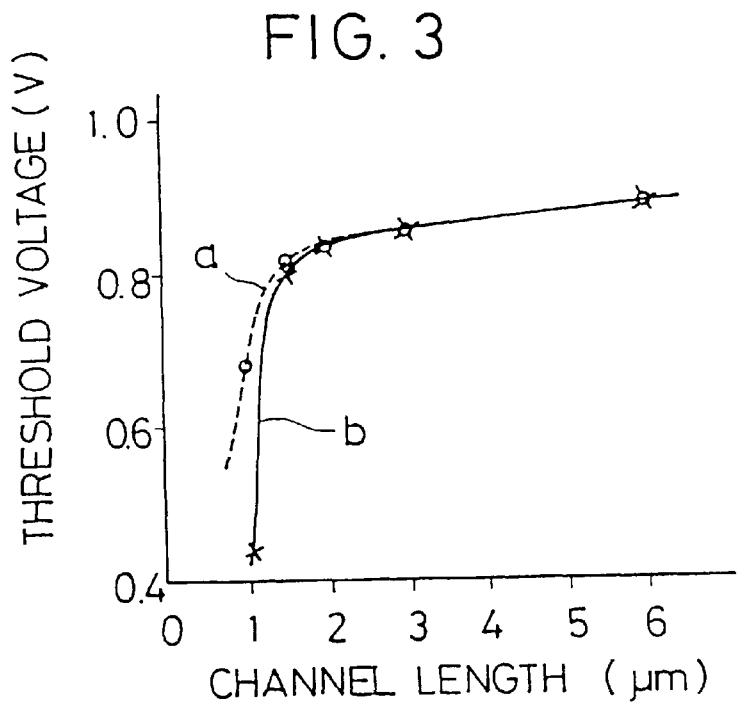
FIG. 3 shows the threshold-dependence on channel length of a MOSFET of the invention and a conventional MOSFET.

FIG. 3 shows the threshold-dependence on channel length of a MOSFET according to the present invention (curve a) and that of a conventional MOSFET manufactured with a substrate of impurity doping concentration of $3 \times 10^{16}$ cm$^{-3}$. The MOSFET according to the invention shown in FIG. 3 has at its channel region an epitaxial growth layer whose thickness is $1 \times 10^{14}$ cm$^{-3}$ and an impurity doping concentration of $1 \times 10^{14}$ cm$^{-3}$. This layer is formed on a substrate having an impurity doping concentration of $1 \times 10^{18}$ cm$^{-3}$. The layer is formed through the use of molecular layer epitaxy or molecular beam epitaxy. The curve a shows threshold-dependence on channel length of the type of a MOSFET according to the invention shown in FIG. 1A, and the curve b the conventional MOSFET. It is clearly seen from FIG. 3 that the MOSFET of the present invention is excellent in preventing short channel effects compared with conventional MOSFETs.

Figure 4:
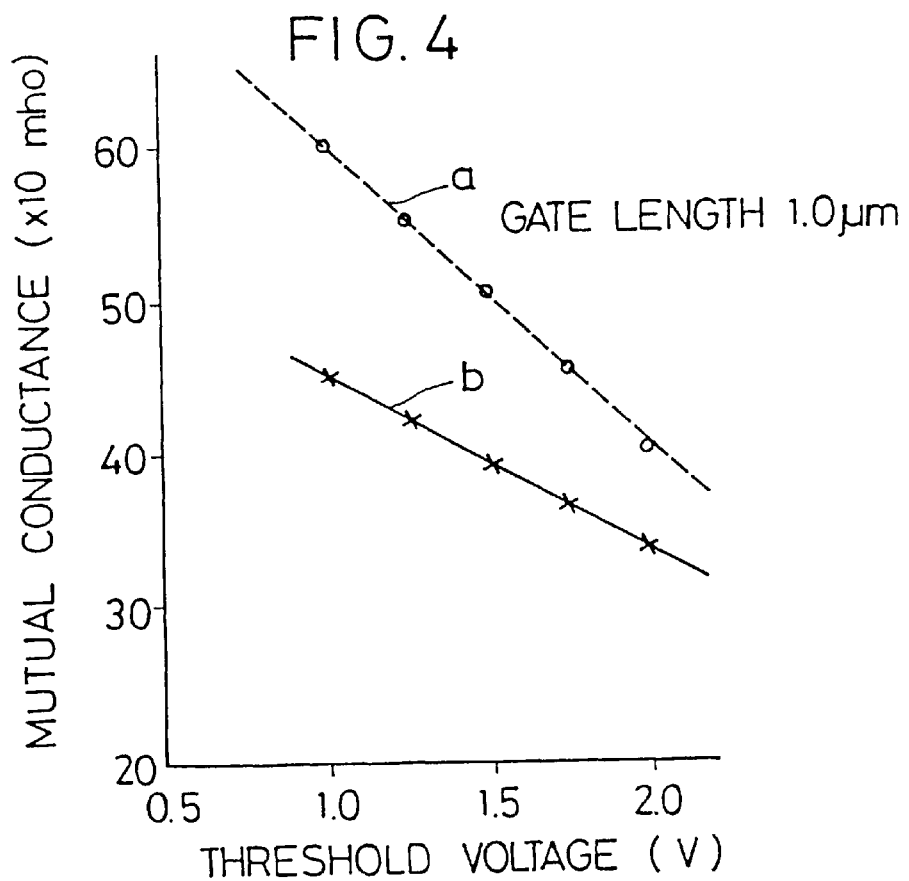
FIG. 4 shows the transconductance-dependence on threshold voltage of MOSFETs shown in FIG. 3, FIG. 5A–FIG. 5J show a manufacturing process of a MOSFET in which a source region and a drain region are formed by ion implantation, and thereafter a channel region is formed by selective epitaxy.

FIG. 4 shows the transconductance-dependence on threshold voltage of a MOSFET of the invention (line a) and a conventional MOSFET (line b) which are shown in FIG. 1A. It is clearly observed from FIG. 4 that a MOSFET of the invention has a carrier mobility more than 20% higher than that of a conventional one at a given threshold voltage.

Figure 5A:
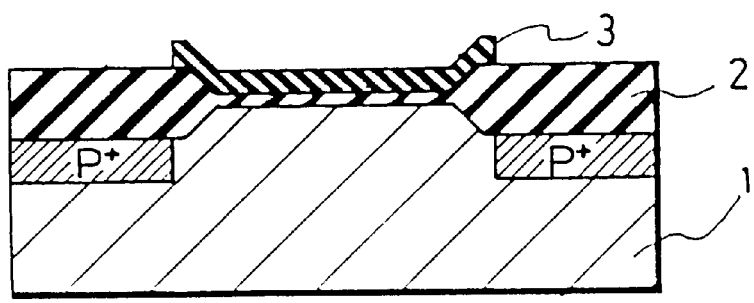
Figure 5B:
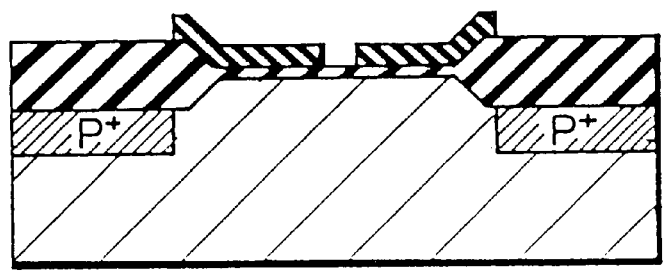
Figure 5C:
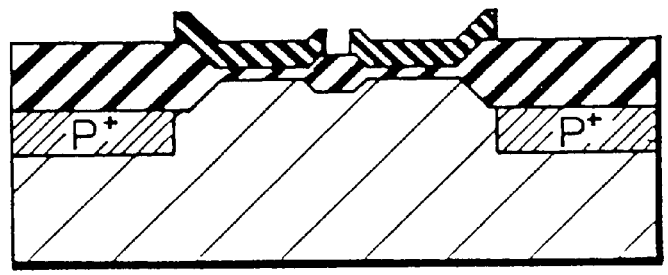
Figure 5D:
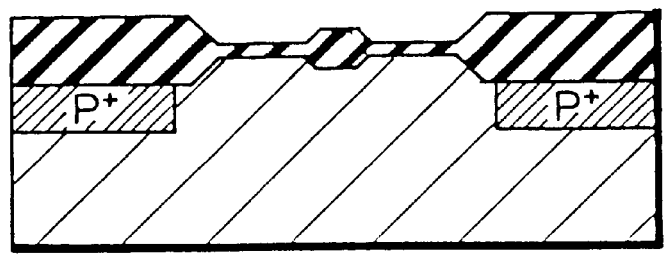
Figure 5E:
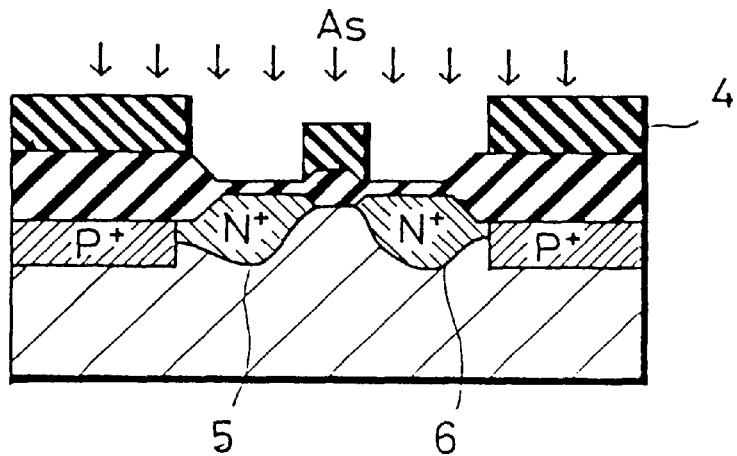
Figure 5F:
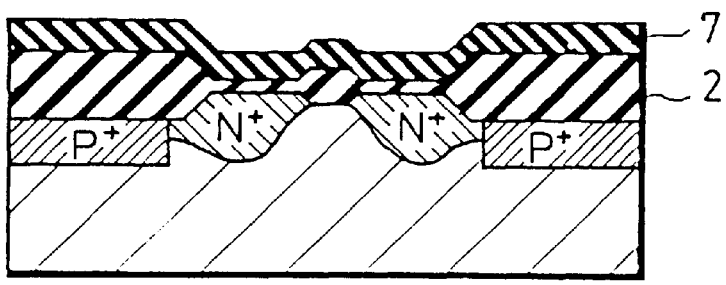
Figure 5G:
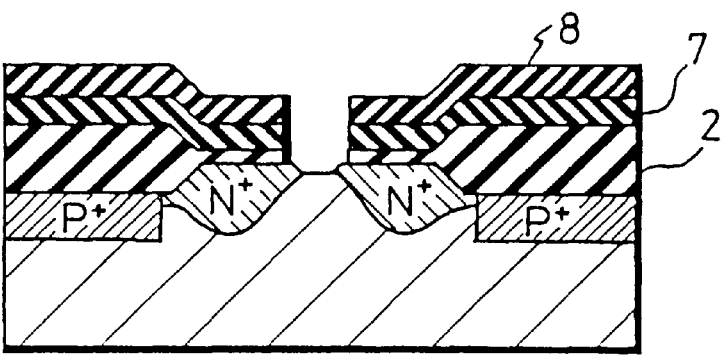
Figure 5H:
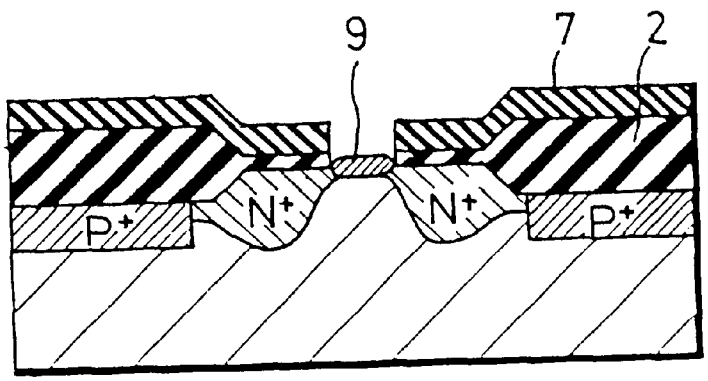
Figure 5I:
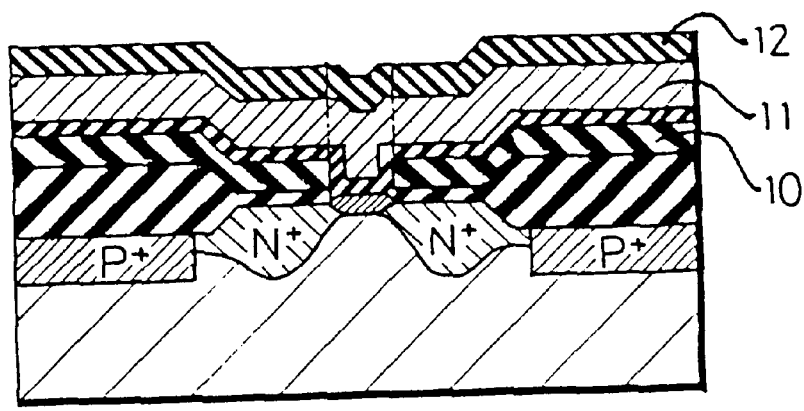
Figure 5J:
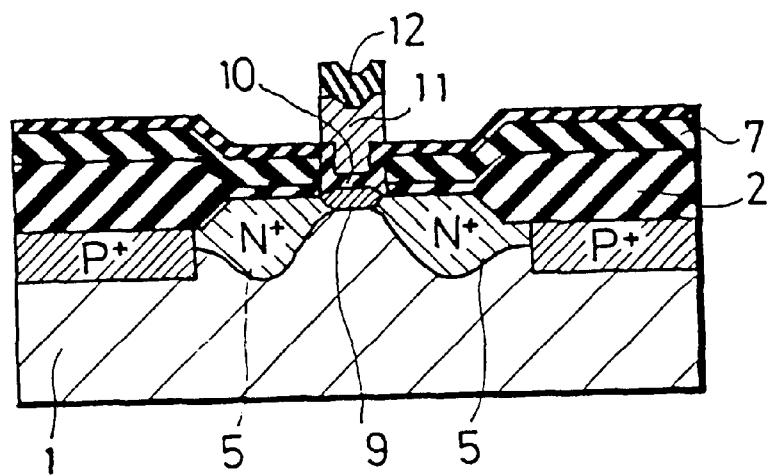

FIGS. 5A to 5J illustrate a manufacturing process of the MOSFET of the invention in which a source and a drain region are formed by ion implantation prior to formation of a channel region. This MOSFET is characterized by the structure in which the channel region is partially curved down into the substrate surface. FIG. 5A shows a cross-section of a conventional LOCOS (Local Oxidation of Silicon). A field oxide film 2 of about 6000 Å thickness and a silicon nitride film 3 of about 3000 Å thickness are formed on a substrate. The silicon nitride film on a channel forming region is partially etched away as shown in FIG. 5B. Thermal oxidation is carried out to form a field oxide film of about 9000 Å thickness and an oxide film of about 3000 Å thickness at the channel forming region as shown in FIG. 5C. FIG. 5D shows a step in which the silicon nitride film is removed. After a resist pattern 4 is formed as shown in FIG. 5E, Arsenic (As) is ion-implanted and annealing is carried out at about 900° C. to form a source 5 and a drain 6. A CVD oxide film 7 of about 3000 Å is deposited as shown in FIG. 5F. By using photo resist all the oxide films at the channel forming region are removed as shown in FIG. 5G. Using the oxide film as a mask, an epitaxial growth layer 9 is selectively deposited as shown in FIG. 5H. The temperature of the substrate during this epitaxial growth is about 800° C., the epitaxial growth layer is grown by the thickness of about 1500 Å, and the impurity doping concentration is about $1\times10^{13}$ cm$^{-3}$. As shown in FIG. 5I, a gate oxide film 10 of about 200 Å thickness is formed by using CVD method at the substrate temperature of 700° C., thereafter an impurity doped poly-silicon 11 is deposited thereon at the substrate temperature of 750° C. All the poly-silicon film except for an area at the gate region is removed as shown in FIG. 5J. The MOSFET fabricated in the manner described hereabove can have a channel region completely free of damages by ion-implantation and without impurity auto-doping from the substrate.

Figure 6A:
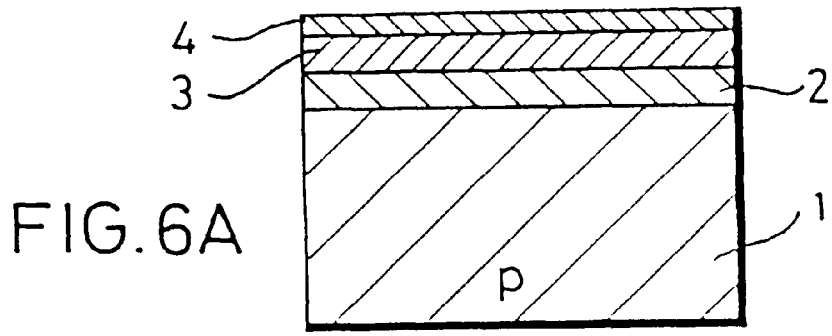
FIG. 6A–FIG. 6C show a manufacturing process of a MOSFET in which three epitaxial growth layers of different thickness and impurity concentration are formed on a substrate.
Figure 6B:
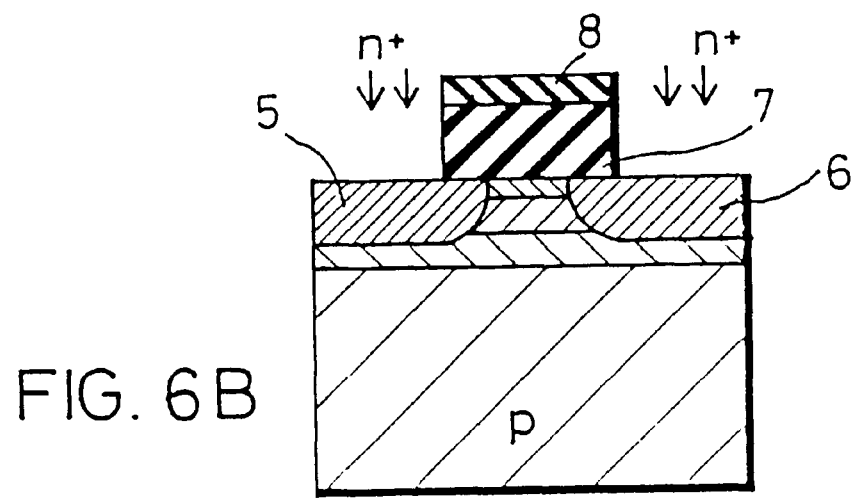
Figure 6C:
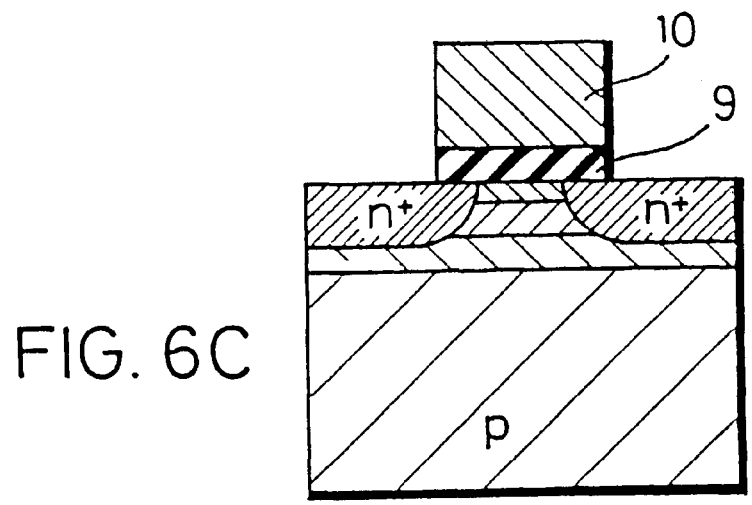

FIGS. 6A to 6C show a manufacturing process of a MOSFET having a structure in which three epitaxial growth layers of different impurity doping concentration and thickness are provided on a substrate. As shown in FIG. 6A, 1st, 2nd and 3rd epitaxial growth layers 2, 3 and 4 are successively deposited on a substrate 1 of high impurity concentration. FIG. 6B shows a step in which a source 5 and a drain 6 are formed by ion implantation using a CVD oxide film 7 and a resist 8 as masks. After completing ion implantation, the CVD oxide film 7 and resist 8 are removed, and thereafter a gate oxide film 9 and a gate 10 are provided as shown in FIG. 6C.

FIG. 7 shows the impurity doping profile and the thickness of the epitaxial growth layers shown in FIG. 6A; the first epitaxial growth layer 2 has a thickness of 1500 Å and an impurity doping concentration of $1\times10^{15}$ cm$^{-3}$, the second epitaxial growth layer 3 respectively 1700 Å and $1\times10^{15}$ cm$^{-3}$, and the third epitaxial growth layer 4 respectively 1000 Å and $1\times10^{14}$ cm$^{-3}$.

Figure 8A:
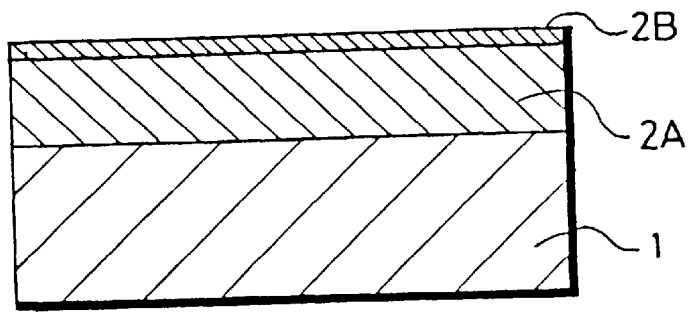
FIG. 8 shows a manufacturing process of a MOSFET having two different epitaxial growth layers.
Figure 8B:
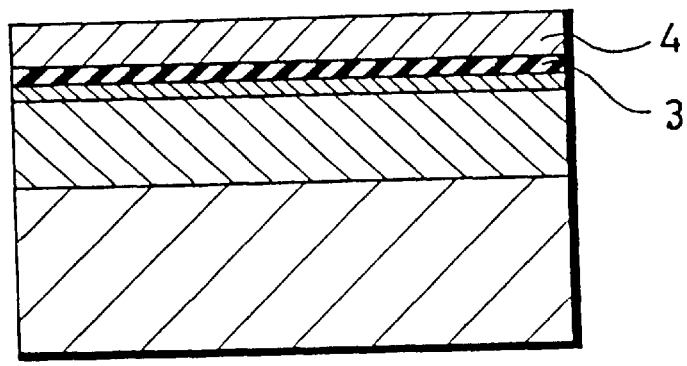
Figure 8C:
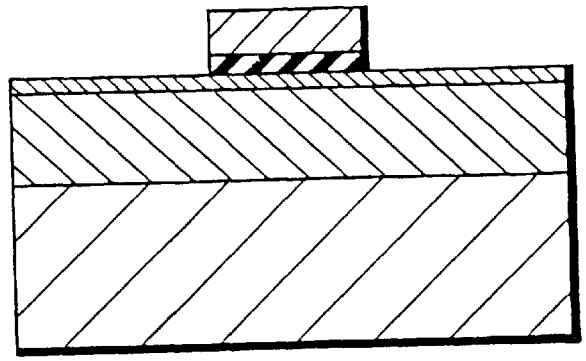
Figure 8D:
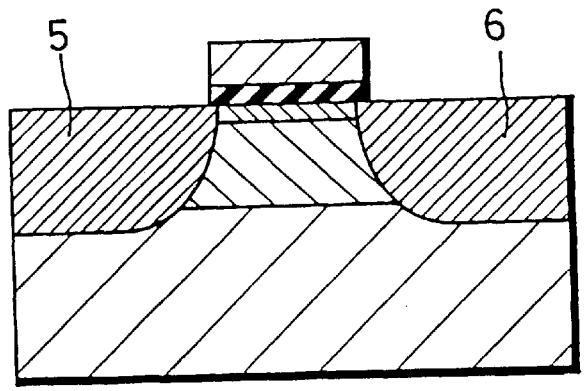

FIG. 8A to FIG. 8D show a process of manufacturing a MOSFET having two epitaxial growth layers of different thickness and impurity concentration in the form shown in FIG. 1B. FIG. 8A shows a step in which two epitaxial growth layers 2A and 2B are formed on a substrate 1 of high impurity doping concentration while controlling impurity doping concentration of the layers. This process employs molecular layer epitaxy which is carried out at a substrate temperature of 850° C. or less. The impurity doping concentration of the substrate 1 is $1\times10^{18}$ cm$^{-3}$. The first epitaxial growth layer 2A has an impurity doping concentration of $1\times10^{13}$ cm$^{-3}$ and a thickness of 3000 Å. The second epitaxial growth layer 2B has an impurity doping concentration of $1\times10^{16}$ cm$^{-3}$ and a thickness of 500 Å. A gate oxide film 3 and a poly-silicon for a gate 4 are deposited using the CVD method as shown in FIG. 8B. In FIG. 8C the gate 4 is provided by patterning with the use of a photo-resist. A source 5 and a drain 6 are formed by ion-implantation using the gate portion as a mask as shown in FIG. 8D.

FIG. 9 shows the vertical impurity doping profile at the channel region of a MOSFET fabricated in the process as described above. Numeral 1 in FIG. 9 is the substrate of high impurity doping concentration, numeral 2 is the first epitaxial growth layer and numeral 3 is the second epitaxial growth layer. A MOSFET fabricated according to the process as described above has a structure in which the junction capacitance between the substrate and the source and drain is small, and the short channel effects are prevented. MOSFETs fabricated according to the invention are very effective in preventing latch-up and short channel effects. Moreover, a high performance in both static and dynamic characteristic which is not possible by conventional devices can be obtained. The present invention provides a novel structure of semiconductor device and its manufacturing method which are highly effective in the improvement of semiconductor device performance.

We claim:

1. A method of manufacturing a MOS field effect transistor, comprising the steps of: forming on a semiconductor substrate a first epitaxial growth layer having an impurity doping concentration lower than that of the semiconductor substrate; forming on the first epitaxial growth layer a second epitaxial growth layer having an impurity concentration higher than that of the first epitaxial growth layer and having a thickness equal to or less than a diffusion depth of a source and a drain region; and forming on the second epitaxial growth layer a third epitaxial growth layer having an impurity concentration lower than that of the second epitaxial growth layer and having a thickness equal to or less than that of a depletion layer at a channel region.

2. A method of manufacturing a MOS field effect transistor according to claim 1; wherein the first, second and third epitaxial growth layers are formed by molecular layer epitaxy.

3. A method of manufacturing a MOS field effect transistor according to claim 1; wherein the first and second epitaxial growth layers are formed by molecular layer epitaxy.

4. A method of manufacturing a MOS field effect transistor according to claim 1; wherein one of the first epitaxial growth layer and the second epitaxial growth layer is formed at a temperature of 850° C. or less.

5. A method of manufacturing a MOS field effect transistor according to claim 2; wherein one of the first epitaxial growth layer and the second epitaxial growth layer is formed at a temperature of 850° C. or less.

6. A method of manufacturing a MOS field effect transistor, comprising the steps of: providing a semiconductor substrate; depositing three epitaxial growth layers successively on a surface of the semiconductor substrate, the epitaxial growth layers having different thicknesses, and at least two of the epitaxial growth layers having different impurity doping concentrations; and forming a source region and a drain region over the surface of the semiconductor substrate by ion implantation.

7. A method of manufacturing a MOS field effect transistor according to claim 5; wherein the step of depositing the three epitaxial growth layers comprises depositing on the surface of the semiconductor substrate a first epitaxial growth layer having an impurity doping concentration lower than that of the semiconductor substrate, depositing on the first epitaxial growth layer a second epitaxial growth layer having an impurity concentration higher than that of the first epitaxial growth layer, and depositing on the second epitaxial growth layer a third epitaxial growth layer having an impurity concentration lower than that of the second epitaxial growth layer.

8. A method of manufacturing a MOS field effect transistor according to claim 7; wherein the second epitaxial growth layer has a thickness greater than a thickness of the first epitaxial growth layer, and the third epitaxial growth layer has a thickness smaller than the thickness of the first epitaxial growth layer.

9. A method of manufacturing a MOS field effect transistor according to claim 6; wherein the step of depositing the three epitaxial growth layers comprises depositing on the surface of the semiconductor substrate a first epitaxial growth layer having an impurity doping concentration lower than that of the semiconductor substrate, depositing on the first epitaxial growth layer a second epitaxial growth layer having a thickness greater than a thickness of the first epitaxial growth layer, and depositing on the second epitaxial growth layer a third epitaxial growth layer having a thickness smaller than a thickness of the first epitaxial growth layer.

10. A method of manufacturing a MOS field effect transistor according to claim 9; wherein the second epitaxial growth layer has an impurity concentration higher than that of the first epitaxial growth layer.

11. A method of manufacturing a MOS field effect transistor according to claim 10; wherein the thickness of the second epitaxial growth layer is equal to or less than a diffusion depth of the source and drain regions.

12. A method of manufacturing a MOS field effect transistor according to claim 9; wherein the thickness of the second epitaxial growth layer is equal to or less than a diffusion depth of the source and drain regions.

13. A method of manufacturing a MOS field effect transistor according to claim 9; wherein the third epitaxial growth layer has an impurity concentration lower than that of the second epitaxial growth layer.

14. A method of manufacturing a MOS field effect transistor according to claim 13; wherein the thickness of the third epitaxial growth layer is equal to or less than that of a depletion layer at a channel region.

15. A method of manufacturing a MOS field effect transistor according to claim 9; wherein the thickness of the third epitaxial growth layer is equal to or less than that of a depletion layer at a channel region.

16. A method of manufacturing a MOS field effect transistor according to claim 9; wherein one of the first epitaxial growth layer and the second epitaxial growth layer is formed at a temperature of 850° C. or less.

17. A method of manufacturing a MOS field effect transistor according to claim 9; wherein the first, second and third epitaxial growth layers are formed by molecular layer epitaxy.

18. A method of manufacturing a MOS field effect transistor according to claim 17; wherein one of the first epitaxial growth layer and the second epitaxial growth layer is formed at a temperature of 850° C. or less.

* * * * *